United States Patent
Kong et al.

(10) Patent No.: US 11,430,826 B2
(45) Date of Patent: Aug. 30, 2022

(54) THIN FILM TRANSISTOR ARRAY SUBSTRATE FOR DIGITAL X-RAY DETECTOR DEVICE AND DIGITAL X-RAY DETECTOR DEVICE INCLUDING THE SAME

(71) Applicant: LG Display Co., Ltd., Seoul (KR)

(72) Inventors: Minsuk Kong, Gyeongsangbuk-do (KR); Soyoung Kim, Seongnam-si (KR); Moonsoo Kang, Daegu (KR); Jaeho Yoon, Gyeongsangbuk-do (KR)

(73) Assignee: LG DISPLAY CO., LTD., Seoul (KR)

( * ) Notice: Subject to any disclaimer, the term of this patent is extended or adjusted under 35 U.S.C. 154(b) by 74 days.

(21) Appl. No.: 17/125,393

(22) Filed: Dec. 17, 2020

(65) Prior Publication Data

US 2021/0193724 A1 Jun. 24, 2021

(30) Foreign Application Priority Data

Dec. 20, 2019 (KR) .................. 10-2019-0171496

(51) Int. Cl.
*H01L 27/146* (2006.01)
*G01T 1/20* (2006.01)

(52) U.S. Cl.
CPC .... *H01L 27/14636* (2013.01); *G01T 1/20184* (2020.05); *H01L 27/14663* (2013.01)

(58) Field of Classification Search
CPC ......... H01L 27/14636; H01L 27/14663; G01T 1/20184
See application file for complete search history.

(56) References Cited

U.S. PATENT DOCUMENTS

| | | | | |
|---|---|---|---|---|
| 5,262,649 A | * | 11/1993 | Antonuk | G01T 1/2018 250/370.11 |
| 2007/0096647 A1 | * | 5/2007 | Choo | H01L 29/78669 257/E27.113 |
| 2007/0145285 A1 | * | 6/2007 | Ishii | H01L 27/14636 250/370.11 |
| 2008/0185529 A1 | * | 8/2008 | Alving | G01T 1/2928 250/370.09 |
| 2009/0001275 A1 | * | 1/2009 | Okada | H04N 5/32 250/370.08 |
| 2009/0065680 A1 | * | 3/2009 | Okada | H01L 27/14683 250/208.1 |
| 2009/0084938 A1 | * | 4/2009 | Okada | H01L 27/14658 250/208.1 |

(Continued)

FOREIGN PATENT DOCUMENTS

KR 10-1031713 B1 4/2011
KR 10-1392160 B1 5/2014

*Primary Examiner* — Blake C Riddick
(74) *Attorney, Agent, or Firm* — Polsinelli PC

(57) ABSTRACT

A thin film transistor array substrate for a digital X-ray detector device includes a base substrate where a driving area and a non-driving area are defined; at least one readout circuit pad disposed in the non-driving area and electrically connected to the drive area; at least one readout circuit pad connection line electrically connecting the driving area to the at least one readout circuit pad; and at least one electrostatic induction line electrically connected to the at least one readout circuit pad connection line, wherein the at least one electrostatic induction line has a greater resistance than a resistance of the at least one readout circuit pad connection line.

20 Claims, 7 Drawing Sheets

(56) References Cited

U.S. PATENT DOCUMENTS

| | | | |
|---|---|---|---|
| 2009/0146147 A1* | 6/2009 | Kim | H01L 27/14676 257/E21.085 |
| 2010/0276604 A1* | 11/2010 | Okada | H01L 27/14676 250/370.09 |
| 2012/0018627 A1* | 1/2012 | Tredwell | H04N 5/357 378/207 |
| 2012/0161018 A1* | 6/2012 | Shin | H01L 27/14658 250/370.09 |
| 2012/0181439 A1* | 7/2012 | Cao | G01T 1/2018 250/366 |
| 2014/0027828 A1* | 1/2014 | Kim | H01L 27/14632 257/292 |
| 2014/0145198 A1* | 5/2014 | Kim | H01L 27/14658 257/67 |
| 2014/0145252 A1* | 5/2014 | Kim | H01L 27/14658 257/292 |
| 2015/0028338 A1* | 1/2015 | Iwata | H01L 27/14683 257/59 |
| 2017/0192108 A1* | 7/2017 | Yoon | G01T 1/241 |
| 2017/0192109 A1* | 7/2017 | Yoon | H01L 27/14632 |
| 2017/0192111 A1* | 7/2017 | Yoon | H01L 27/14659 |
| 2019/0115385 A1* | 4/2019 | Moriwaki | H01L 27/14663 |
| 2019/0123080 A1* | 4/2019 | Kanicki | H01L 27/14676 |
| 2019/0165008 A1* | 5/2019 | Lee | H01L 27/1225 |
| 2019/0196030 A1* | 6/2019 | Yang | G01T 1/247 |
| 2021/0202779 A1* | 7/2021 | Hou | H01L 25/167 |

\* cited by examiner

THIN FILM TRANSISTOR ARRAY SUBSTRATE FOR DIGITAL X-RAY DETECTOR DEVICE AND DIGITAL X-RAY DETECTOR DEVICE INCLUDING THE SAME

CROSS REFERENCE TO RELATED APPLICATION

The present disclosure claims priority to and the benefit of Korean Patent Application No. 10-2019-0171496, filed on Dec. 20, 2019, the disclosure of which is incorporated herein by reference in its entirety.

BACKGROUND

Field of the Disclosure

The present disclosure relates to a thin film transistor array substrate for a digital X-ray detector device capable of minimizing a defect due to an inflow of static electricity and the digital X-ray detector device including the same.

Description of the Background

Because X-ray is of a short wavelength, the X-ray may pass through an object easily. The transmittance of the X-ray depends on an inner density of the object. Therefore, an internal structure of the object may be observed by detecting an amount of the X-ray transmitted through the object.

One of X-ray based inspection methods used in a medical field is a film printing scheme. However, in the film printing scheme, to check a result, an image is shot, and then a film is printed. Thus, it takes a long time to check the result. Especially, in the film printing scheme, there are some difficulties in storing and preserving the printed film.

A digital X-ray detector (DXD) device using a thin film transistor has been developed and widely used in the medical field.

The DXD device detects the transmittance of the X-ray transmitted through the object and displays an internal state of the object on a display based on the transmittance.

Therefore, the digital X-ray detector device may display the internal structure of the object without using an additional film and printed paper. Further, the DXD device may check the results in real time immediately after X-ray photographing.

A digital X-ray detector device detects current inside a digital X-ray detection panel to implement an image based on the current and includes a photo PIN (P type semiconductor-Intrinsic type semiconductor-N type semiconductor) diode that responds to light and various types of elements such as a driving thin film transistor that drives the photo PIN diode.

Defects of elements may occur based on static electricity introduced into the elements because the elements are susceptible to electric shock such as static electricity introduced from outside.

For example, display devices such as liquid crystal display (LCD) devices or organic light emitting display (OLED) devices include electrostatic discharge (ESD) prevention circuits to solve the static electricity.

The ESD prevention circuit may operate such that the ESD occurs and overvoltage is applied to the element, the overvoltage is discharged through the ESD prevention circuit connected to a ground terminal.

Therefore, the display device includes the ESD prevention circuit at a data line or a connection line connecting a data pad to a display area to solve the static electricity introduced through the data line or the connection line.

In some examples, the digital X-ray detector device includes a readout circuit pad. The readout circuit pad may be electrically connected to the driving area through a readout line or the connection line.

In contrast to the data pad of the display device, the readout circuit pad may function to apply a signal and may also function to read a readout signal as a data signal from the driving area.

In some cases where the display device includes the ESD prevention circuit at the readout line or the connection line between the readout circuit pad and the driving area, noise may occur in a readout signal value due to signal interference. Therefore, the digital X-ray detector device may not include the ESD prevention circuit.

In some cases where the display device may not include the ESD prevention circuit in the readout circuit pad area to avoid the signal interference, defects of the elements caused by the static electricity introduced through the readout circuit pad area may not be solved.

SUMMARY

Accordingly, the present disclosure provides a thin film transistor array substrate for a digital X-ray detector device capable of minimizing the defects caused by the inflow of the static electricity as well as minimizing the signal interference and the digital X-ray detector device including the same.

In addition, the present disclosure provides a thin film transistor array substrate for a digital X-ray detector device and the digital X-ray detector device capable of minimizing the defects caused by the static electricity introduced into the readout circuit pad or the readout line and the digital X-ray detector device.

The present disclosure also provides a thin film transistor array substrate for a digital X-ray detector device and the digital X-ray detector device capable of minimizing the defects caused by the static electricity introduced into the readout circuit pad or the readout line as well as minimizing the occurrence of the noise in the readout circuit signal due to the signal interference.

The present disclosure further provides a thin film transistor array substrate for a digital X-ray detector device and the digital X-ray detector device capable of minimizing the defects caused by the static electricity that may be generated during a cell array process performed on a parent substrate.

The present disclosure is not limited to the above-mentioned objects, and the other objects and advantages of the present disclosure, which are not mentioned, may be understood by the following description, and more clearly understood by the aspects of the present disclosure. It is also readily understood that the objects and the advantages of the present disclosure may be implemented by features described in appended claims and a combination thereof.

According to an aspect of the present disclosure, there are provided a thin film transistor array substrate for a digital X-ray detector device and the digital X-ray detector device capable of minimizing defects caused by the inflow of the static electricity without designing the ESD prevention circuit in the readout circuit pad area.

According to an aspect of the present disclosure, a thin film transistor array substrate for a digital X-ray detector device and the digital X-ray detector device include a base substrate with a driving area and a non-driving area, at least one readout circuit pad disposed within the non-driving area and electrically connected to the driving area, and at least one readout circuit pad connection line configured to electrically connect the driving area to the at least one readout circuit pad and at least one electrostatic induction line is further connected to the readout circuit pad connection line and has a greater resistance than a resistance of the readout circuit pad connection line.

In this case, the electrostatic induction line may not overlap with the readout circuit pad connection line and may be disposed between the readout circuit pad connection lines that are adjacent to each other.

In addition, the electrostatic induction line may have a width that is thinner than that of the readout circuit pad connection line and at least one capacitor may be disposed below the electrostatic induction line.

In addition, according to another aspect, the electrostatic induction line overlaps with the readout circuit pad connection line and may be disposed below the readout circuit pad connection line.

In this case, the electrostatic induction line may be made of material including indium tin oxide (ITO) and the electrostatic induction line may have a pattern in which an increase or a decrease in width is repeated.

In addition, according to an aspect of the present disclosure, the digital X-ray detector device includes a thin film transistor array substrate, a readout circuitry connected to a readout circuit pad, at least one readout circuitry connection line disposed above the base substrate and configured to electrically connect the at least one readout circuit pad to the readout circuitry, and a scintillator layer disposed above the thin film transistor array substrate and at least one electrostatic induction line may be further connected to the readout circuitry connection line.

According to the present disclosure, at least one electrostatic induction line with greater resistance is connected to the readout circuit pad connection line electrically connecting the driving area to the readout circuit pad to burst the electrostatic induction line based on the static electricity introduced from outside, thereby minimizing defects caused by the static electricity introduced through the readout circuit pad or the readout line without designing the additional ESD prevention circuit.

Further, according to the present disclosure, defects caused by the static electricity may be minimized without designing an additional ESD prevention circuit in the readout circuit pad area, thereby minimizing the occurrence of noise in the readout circuit signal due to the signal interference and the defects caused by the static electricity.

In addition, according to the present disclosure, the electrostatic induction line may be connected to the readout circuitry connection line connected to an MPS line for mass product system (MPS) test to minimize the defects caused by the static electricity that may be introduced from outside during a cell array process performed on a parent substrate.

Specific effects of the present disclosure, in addition to the above-mentioned effects, will be described together while describing specific matters to implement the present disclosure.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
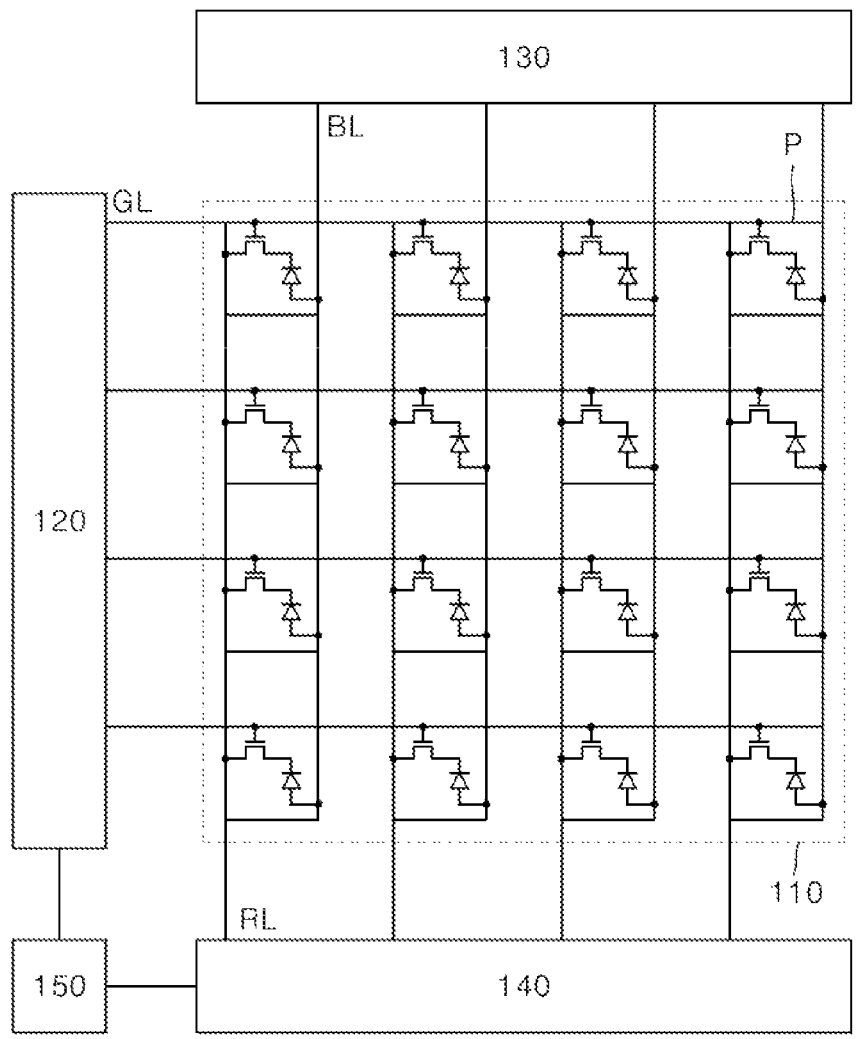
FIG. 1 is a schematic block diagram showing an example digital X-ray detector device in the present disclosure.

Some aspects of the present disclosure are described in detail with reference to the accompanying drawings. Accordingly, the skilled person in the art to which the present disclosure pertains may easily implement the technical idea of the present disclosure. In the description of the present disclosure, if it is determined that a detailed description of a well-known technology relating to the present disclosure may be omitted if it unnecessarily obscures the gist of the present disclosure. One or more aspects of the present disclosure are described in detail with reference to the accompanying drawings. In the drawings, same reference numerals may be used to refer to same or similar components.

In this document, the terms "upper," "lower," "on," "under," or the like are used such that, where a first component is arranged at "an upper portion" or "a lower portion" of a second component, the first component may be arranged in contact with the upper surface (or the lower surface) of the second component, or another component may be disposed between the first component and the second component. Similarly, where a first component is arranged on or under a second component, the first component may be arranged directly on or under (in contact with) the second component, or one or more other components may be disposed between the first component and the second component.

Further, the terms "connected," "coupled," or the like are used such that, where a first component is connected or coupled to a second component, the first component may be directly connected or able to be connected to the second component, or one or more additional components may be disposed between the first and second components, or the first and second components may be connected or coupled through one or more additional components.

Hereinafter, a thin film transistor array substrate for a digital X-ray detector device and a digital X-ray detector device including the same according to some aspects of the present disclosure are described.

FIG. 1 is a schematic block diagram showing a digital X-ray detector device. The digital X-ray detector device may include a thin film transistor array 110, a gate driver 120, a bias supply 130, a readout integrated circuit (IC) 140, and a timing controller 150.

The thin film transistor array 110 may include a plurality of cell regions defined by a plurality of gate lines GL arranged in a first direction and by a plurality of readout lines RL arranged in a second direction orthogonal to the first direction.

The cell regions are arranged in a matrix configuration. Each cell region may include a pixel region in which photo-sensitive pixels Ps are formed. The thin film transistor array 110 may detect the X-ray emitted from an X-ray source, may convert the detected X-ray into an electrical signal, and may output the electrical signal.

Each photo-sensitive pixel may include a PIN diode which converts light of a visible light region converted from the X-ray by a scintillator into an electrical signal and outputs the electrical signal and a thin film transistor TFT that transmits a detected signal output from the PIN diode to a readout circuitry 140. A first end of the PIN diode may be connected to the thin film transistor and a second end thereof may be connected to a bias line BL.

A gate electrode of the thin film transistor may be connected to the gate line GL which carries a scan signal. Source/drain electrodes of the thin film transistor may be respectively connected to the PIN diode and a readout line RL which carries the detected signal output from the PIN diode. Each bias line BL may extend in a parallel manner to each readout line RL.

The gate driver 120 may sequentially apply gate signals to thin film transistors of photo-sensitive pixels through the gate lines GLs. The thin film transistors of the photo-sensitive pixels may be turned on in response to the gate signals having a gate-on voltage level.

The bias supply 130 may apply driving voltages to the photo-sensitive pixels through the bias lines BL. The bias supply 130 may selectively apply a reverse bias or a forward bias to the PIN diode.

The readout circuitry 140 may read out the detected signal received from the thin film transistor turned on in response to the gate signal of the gate driver. For example, the detected signal output from the PIN diode may be input to the readout circuitry 140 through the thin film transistor and the readout line RL.

The readout circuitry 140 may have an offset readout period for which an offset image is read out and an X-ray readout period for which the detected signal after an X-ray exposure is read out and may read out the detection signal output from the photo-sensitive pixels during the X-ray readout period.

The readout circuitry 140 may include a signal detector and a multiplexer. The signal detector includes a plurality of amplification circuitry that correspond respectively to the readout lines RL. Each amplification circuitry may include an amplifier, a capacitor, and a reset element.

The timing controller 150 may control an operation of the gate driver 120 by generating a start signal and a clock signal and supplying each of the start signal and the clock signal to the gate driver 120. Further, the timing controller 150 may control an operation of the readout circuitry 140 by generating a readout control signal and a readout clock signal and supplying each of the readout control signal and the readout clock signal to the readout circuitry 140.

Figure 2:
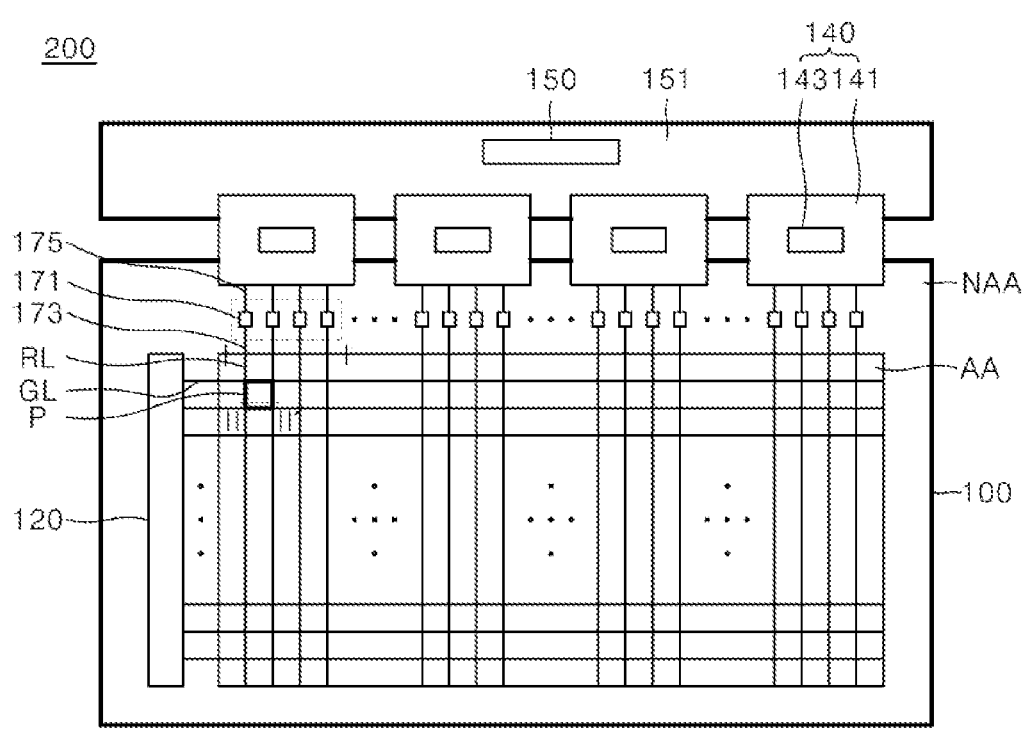
FIG. 2 is a schematic plan view showing an example digital X-ray detector device in the present disclosure.

FIG. 2 is a schematic plan view showing an example digital X-ray detector.

A thin film transistor array substrate 100 for a digital X-ray detector device includes a driving area AA and a non-driving area NAA. The driving area AA includes one or more pixels P and the non-driving area NAA surrounds a periphery of the driving area AA.

A gate driver 120 may include one or more gate driver integrated circuits (IC) and may be disposed within the non-driving area NAA of the array substrate 100 at one side or both sides of the array substrate 100.

The type of the gate driver 120 may be a gate in panel (GIP) type and the gate driver 120 may be electrically connected to pixels in the driving area AA through one or more gate lines.

One or more readout circuit pads 171 are disposed at one side of the non-driving area NAA of the array substrate 100 on which the gate driver 120 is not disposed and a readout circuitry connection line 173 may be disposed between the readout circuit pad 171 and the driving area AA.

The readout circuit pads 171 may be electrically connected to the pixels of the driving area AA through the readout circuit pad connection lines 173.

In this case, the readout circuit pad connection line 173 may be connected to the pixels through additional readout line RL, but is not limited thereto. The readout circuit pad connection line 173 and the readout line RL may be integrated with each other.

A readout circuit pad connection line 173 may be connected to a first side of the readout circuit pad 171 and a readout circuitry connection line 175 may be disposed to a second side of the readout circuit pad 171.

The readout circuitry connection line 175 is disposed between the readout circuitry 140 and the readout circuit pad 171 and electrically connects the readout circuitry 140 to the readout circuit pad 171.

The readout circuitry 140 may be implemented using a chip-on-glass (COG) method or a chip-on-film (COF) method. For example, the readout circuitry 140 may include at least one readout circuit IC 143 which is at least one readout IC and a flexible film 141.

In this case, each readout circuit 143 is mounted on the flexible film 141, a first end of the flexible film 141 is bonded to a control printed circuit board (PCB) 151, and a second end of the flexible film 141 is bonded to the array substrate 100 to be electrically connected to the readout circuitry connection line 175.

In the present disclosure, a readout circuit region refers to a non-driving area NAA of the array substrate 100 to support the readout circuit pad 171 and the readout circuitry 140, in the non-driving area NAA of the array substrate 100.

A plurality of circuits implemented with driving chips may be mounted on the control PCB 151, for example, a timing controller 150 may be disposed on the control PCB 151.

A power controller may be further disposed on the control PCB 151 to supply voltages or current to each of the array substrate 100, the gate driver 120, and the readout circuitry 140 or control the supplying voltages or current.

Hereinafter, an aspect of the present disclosure is described in more detail with reference to FIG. 3, which is an enlarged plan view showing an example area taken along line of I-I' (shown in FIG. 2) of a digital X-ray detector.

At least one readout circuit pad 171 electrically connected to the driving area AA is disposed within the readout circuit region of the non-driving area NAA.

In addition, at least one readout circuit pad connection line 173 is disposed between the driving area AA and the at least one readout circuit pad 171 to electrically connect the driving area AA and the at least one readout circuit pad 171 and each of the readout circuit pad connection lines 173 is connected to a first end of one of the readout circuit pads 171.

In this case, at least one electrostatic induction line 180 is further connected to the readout circuit pad connection line 173 and has higher resistance than that of the readout circuit pad connection line 173.

The electrostatic induction line 180 may not overlap with the readout circuit pad connection line 173 and is disposed between the two adjacent readout circuit pad connection lines 173, such that the electrostatic induction line 180 may be arranged parallel to the readout circuit pad connection line 173 along the readout circuit pad connection line 173.

The at least one electrostatic induction line 180 is spaced apart from the at least one readout circuit pad connection line 173 and may be electrically connected to the at least one readout circuit pad connection line 173 through at least one electrostatic induction bridge line 181.

In this case, the electrostatic induction bridge lines 181 are disposed at both ends of the electrostatic induction line 180 to electrically connect the electrostatic induction line 180 to the readout circuit pad connection line 173.

The electrostatic induction line 180 and the electrostatic induction bridge line 181 may each be made of the same material as the readout circuit pad connection line 173 and the electrostatic induction line 180, the electrostatic induction bridge line 181, and the readout circuit pad connection line 173 may be integrated with one another.

In some examples, the electrostatic induction line 180 and the electrostatic induction bridge line 181 each have a thinner width than that of the readout circuit pad connection line 173 and each have a greater resistance than that of the readout circuit pad connection line 173.

When the static electricity is introduced through the readout circuit pad connection line 173, the readout circuit pad connection line 173 may not bust, but the electrostatic induction line 180 or the electrostatic induction bridge line 181 may burst at an area with greater resistance, because the electrostatic induction line 180 and the electrostatic induction bridge line 181 each have a greater resistance than that of the readout circuit pad connection line 173.

Figure 3:
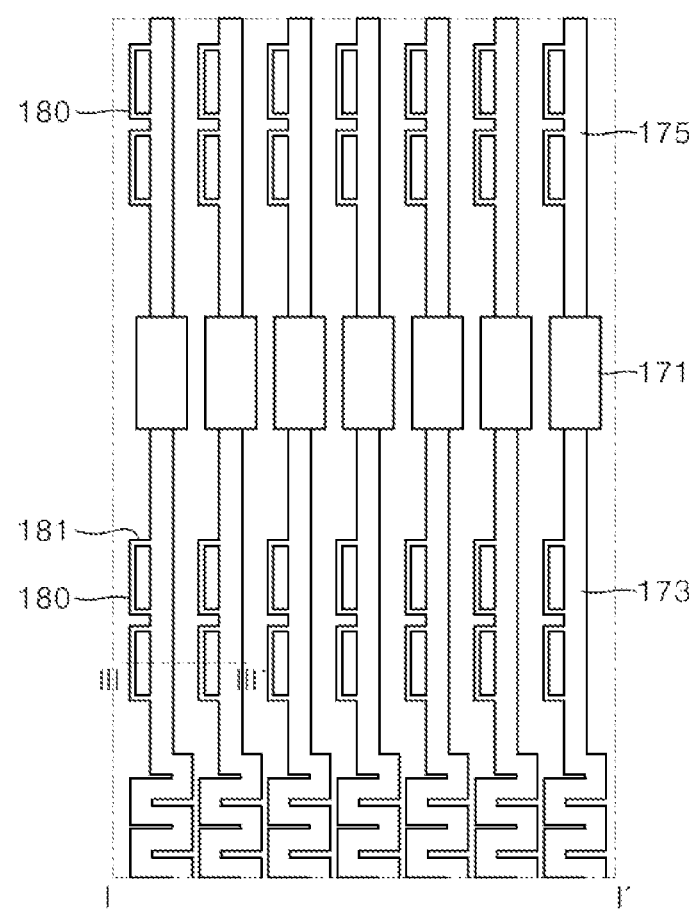
FIG. 3 is a plan enlarged view showing an example area taken along line I-I' of a digital X-ray detector device in the present disclosure.

In some examples, the electrostatic induction line 180 may have a straight pattern as shown in FIG. 3, but is not limited thereto, and may have a pattern with greater resistance, such as a zigzag pattern or a pattern in which a width of the electrostatic induction line 180 is repeatedly increased or decreased. When the electrostatic induction line 180 has the pattern with the greater resistance, the electrostatic induction line 180 may easily burst at an area with the pattern.

When the static electricity flows into the readout circuit pad connection line 173, the electrostatic induction line 180 bursts to dissipate the static electricity, thereby minimizing damages to elements due to the introduction of the static electricity into the driving area.

In particular, the burst of the electrostatic induction line 180 may not affect the readout circuit pad connection line 173, thereby stably detecting the readout circuit signal without abnormality.

In addition, according to the present disclosure, the electrostatic induction line 180 additionally connected to the readout circuit pad connecting line 173 may minimize the occurrence of the static electricity introduced from outside without forming additional electrostatic discharge (ESD) prevention circuit in the readout circuit pad connection line 173 to minimize the occurrence of the noise in the readout circuit signal due to signal interference and defects caused by the static electricity.

An electrostatic induction line 180 may be connected to a readout circuit pad connection line 173. In some examples, a plurality of electrostatic induction lines 180 are connected to a readout circuit pad connection line 173 to minimize the damage to the elements due to the inflow of the static electricity.

In some cases where the plurality of electrostatic induction lines 180 are connected to one readout circuit pad connection line 173, a first electrostatic induction line 180 bursts based on the inflow of the static electricity, and subsequently, a second electrostatic induction line 180 may further burst based on the further inflow of the static electricity. Therefore, the defects caused by the static electricity may be minimized even if the static electricity is continuously introduced.

Figure 4:
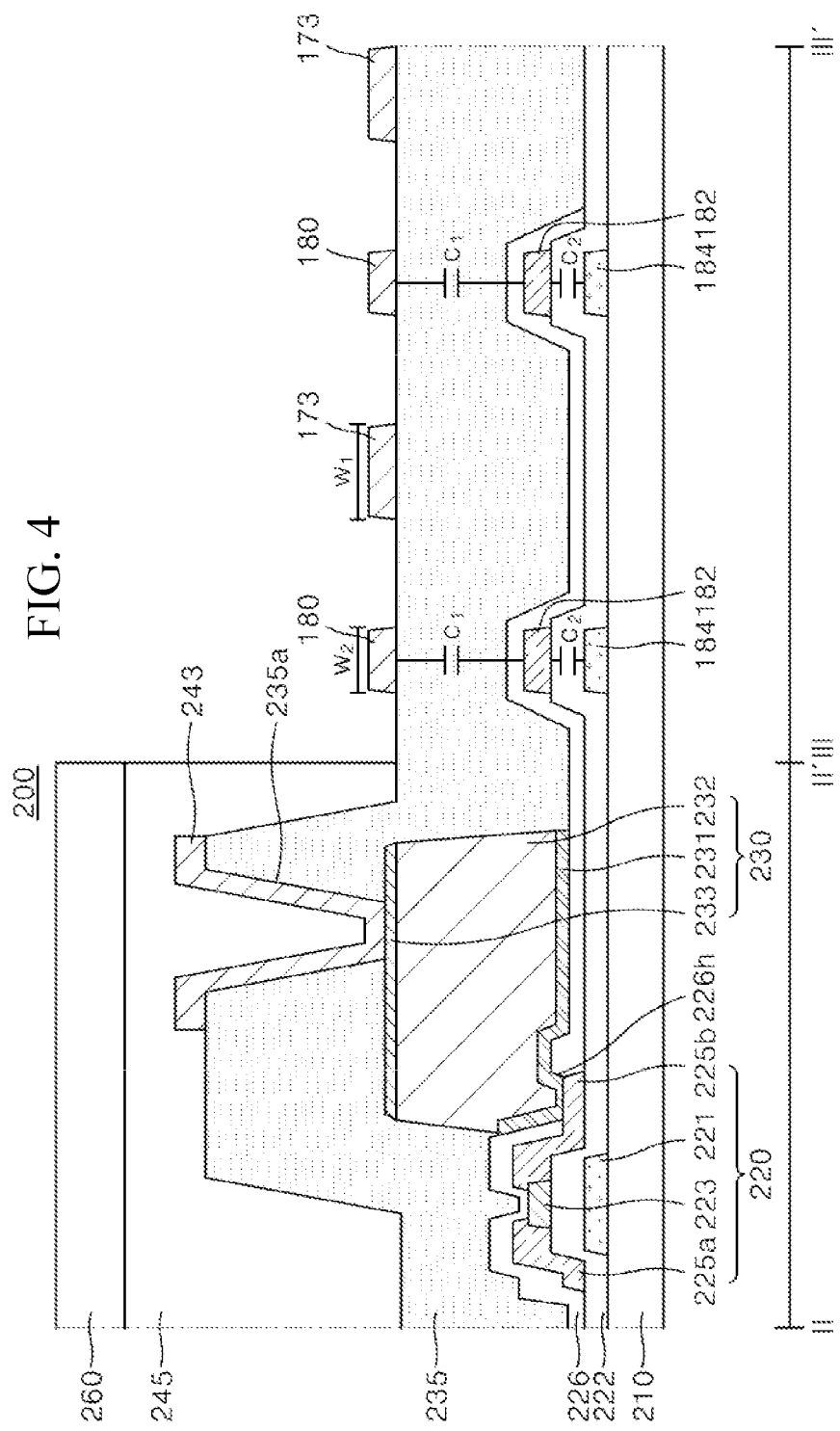
FIG. 4 is an enlarged cross-sectional view showing an example area taken along each of line II-II' and line II-II' of a digital X-ray detector device in the present disclosure.

In some examples, as shown in FIG. 4, which will be described in more detail below, one or more capacitors C1 and C2 are each disposed below the electrostatic induction line 180 and the static electricity introduced into the electrostatic induction line 180 is accumulated on the capacitors to facilitate the burst of the electrostatic induction line 180.

In some cases where the capacitors are disposed below the electrostatic induction line 180, the static electricity introduced from outside is accumulated in the capacitors, and when static electricity is accumulated in the capacitors, with exceeding an allowable amount of static electricity or more of the capacitors, the capacitors may burst to further minimize the damage to the elements due to the inflow of the static electricity.

In this case, the amount of static electricity accumulated in the capacitors may be increased by disposing the plurality of capacitors to effectively dissipate the static electricity even when a large amount of static electricity is introduced.

In some examples, the readout circuitry connection line 175 is connected to the readout circuit pad 171 at the second side opposite to the first side of the readout circuit pad 171 to which the readout circuit pad connection line 173 is connected.

The readout circuitry connection line 175 is disposed between the readout circuit pad 171 and the readout circuit portion 140 to electrically connect the readout circuit pad 171 to the readout circuit portion 140.

An electrostatic induction line 180 may be additionally connected to the readout circuitry connection line 175 to dissipate the static electricity introduced through the readout circuitry 140 or the readout circuitry connection line 175.

In addition, the electrostatic induction line 180 is connected to the readout circuitry connection line 175 to minimize the occurrence of the static electricity introduced from the mass product system (MPS) line for testing the lines after the cell array process.

The cell array process refers to a process of defining a plurality of array areas on a parent substrate and forming a thin film transistor array including a gate line, a readout line, a driving thin film transistor, and a PIN diode in each defined array area.

After the cell array process is performed, an MPS test is performed to check disconnection and short circuit defects of each signal line of the thin film transistor array to thereby determine the defects. If it is to be determined to be defective based on the MPS test, a repair process is additionally performed.

To perform the MPS test, at least one MPS line made of metal is formed during the cell array process, to be used to perform the subsequent MPS test. The MPS line may be removed during the cutting process of the parent substrate into array regions, which is subsequent to MPS test.

The readout circuitry connection line 175 is connected to the MPS line during the cell array process and is also connected to the electrostatic induction line 180. As described above, the readout circuitry connection line 175 is connected to the electrostatic induction line 180 as well as the MPS line to minimize the defects caused by the static electricity that may be introduced from outside during the cell array process performed on the parent substrate.

For example, the electrostatic induction line 180 is connected to the readout circuitry connection line 175 to effectively solve the static electricity generated during the MPS test process.

In addition, when the readout circuitry 140 is connected to the readout circuitry connection line 175 after the cell array process and the cutting process, the electrostatic induction line 180 may effectively minimize the damages to the elements due to the inflow of the static electricity to the readout circuitry 140.

Therefore, the electrostatic induction line 180 is additionally connected to the readout circuit portion connection line 175 to effectively solve the static electricity that may be generated in all situations, from the cell array process to a final process of forming a digital X-ray detector device.

FIG. 4 is an enlarged cross-sectional view showing example area taken along line II-II' (shown in FIG. 2) and line III-III' (shown in FIG. 3) of a digital X-ray detector device. Hereinafter, an aspect of the present disclosure is described with reference to FIG. 4.

A digital X-ray detector 200 according to one aspect of the present disclosure includes a base substrate 210.

The base substrate 210 may be embodied as a glass substrate made of glass, but is not limited thereto. In some cases where the base substrate 210 is used for a flexible digital X-ray detector device, a substrate made of polyimide material and having flexible properties may be used as an example of the base substrate 210.

The driving area AA of the base substrate 210 includes a plurality of pixel areas.

Each pixel includes the thin film transistor 220 and the PIN diode 230. The plurality of thin film transistors 220 and the plurality of PIN diodes 230 may be disposed on an array substrate having the plurality of pixel regions. The thin film transistor 220 and the PIN diode 230 of the pixel are described below and this configuration may also be applied to adjacent pixels unless otherwise specified.

A thin film transistor 220 including a first electrode 225a, a second electrode 225b, a gate electrode 221, and an active layer 223 is disposed on or above the base substrate 210.

A buffer layer may be disposed between the base substrate 210 and the thin film transistor 220. In this case, the buffer layer may be made of an inorganic material such as silicon oxide (SiOx) or silicon nitride (SiNx) and may be provided as a multi-buffer layer composed of multiple sub-layers.

The gate electrode 221 may be disposed on the base substrate. The gate electrode 221 may be made of one selected from a group consisting of molybdenum (Mo), aluminum (Al), chromium (Cr), gold (Au), titanium (Ti), nickel (Ni), copper (Cu), and alloy thereof and may include a single layer or multiple layers.

The gate electrode 221 may extend from a gate line GL. The gate line GL and the gate electrode 221 may be integrated with each other such that the gate electrode 221 is disposed in the gate line GL. Accordingly, the gate line GL and the gate electrode 221 may be disposed on the same layer.

The gate insulation layer 222 may be disposed on the gate electrode 221 and the active layer 223 may be disposed on the gate insulation layer 222.

The active layer 223 may be made of an oxide semiconductor material such as indium gallium zinc oxide (IGZO), but is not limited thereto, and may be made of low temperature polycrystalline silicon (LTPS) or amorphous silicon (a-Si).

The first electrode 225a may be disposed on the active layer 223 to be connected to a first end of the active layer 223. The second electrode 225b may be disposed on the active layer 223 to be connected to a second end of the active layer 223.

In this case, the first electrode 225a may bed branched from readout line RL and may be electrically connected by an additional connection electrode connecting the readout line RL to the first electrode 225a.

The first electrode 225a may be made of, but is not limited to, one selected from a group consisting of molybdenum (Mo), aluminum (Al), chromium (Cr), gold (Au), titanium (Ti), nickel (Ni), copper (Cu) and alloys thereof.

The second electrode 225b may be a source electrode connected to the PIN diode 230 and the first electrode 225a may be a drain electrode, but is not limited thereto, and the positions of the source region and the drain region may be interchanged.

A first passivation layer 226 as an insulating layer may be disposed above the active layer 223 and on each of the first electrode 225a and the second electrode 225b. The first passivation layer 226 may made of an inorganic material such as silicon oxide (SiOx) or silicon nitride (SiNx), but is not limited thereto.

The PIN diode 230 is disposed on or above the first passivation layer 226 and is connected to the lower thin film transistor 220. The PIN diode 230 may be disposed in the pixel region.

The PIN diode 230 may include a lower electrode 231 connected to the thin film transistor 220, a PIN layer 232 on the lower electrode 231, and an upper electrode 233 on the PIN layer 232.

The lower electrode 231 may serve as a pixel electrode in the PIN diode 230. The lower electrode 231 may be made of an opaque metal such as molybdenum Mo or at least one of transparent oxides such as indium tin oxide (ITO), indium zinc oxide (IZO), and zinc oxide (ZnO), depending on characteristics of the PIN diode 230.

The lower electrode 231 may be connected to the second electrode 225b of the thin film transistor 220 via a second contact hole 226h as a contact hole in the first passivation layer 226, such that the thin film transistor 220 may be connected to the PIN diode 230.

The PIN layer 232 may be disposed on the lower electrode 231 to convert a visible light, which has been converted from the X-ray, into an electrical signal. In this connection, a scintillator may convert the X-ray into the visible light.

The PIN layer 232 may be formed by sequentially stacking, on the lower electrode 231, an N (Negative) type semiconductor layer containing N type impurities, an I (Intrinsic) type semiconductor layer, and a P (Positive) type semiconductor layer containing P type impurities.

The I-type semiconductor layer may be relatively thicker than each of the N-type semiconductor layer and the P-type semiconductor layer. The PIN layer 232 may be made of a material capable of converting the visible light into which the X-ray emitted from an X-ray source is converted into an electrical signal, for example, a-Se, $HgI_2$, CdTe, PbO, $PbI_2$, $BiI_3$, GaAs, and Ge.

The upper electrode 233 may be disposed on the PIN layer 232. The upper electrode 233 may be made of at least one of transparent oxides such as indium tin oxide (ITO), indium zinc oxide (IZO), and zinc oxide (ZnO) and may improve a fill factor of the PIN diode 230.

A second passivation layer 235 may be disposed above the PIN diode 230. The second passivation layer 235 may be made of an inorganic material such as silicon oxide (SiOx) or silicon nitride (SiNx), but is not limited thereto. The second passivation layer 235 may cover up to a side surface of the PIN diode 230 to protect the side surface of the PIN diode 230 from moisture or other foreign substances.

A bias electrode 243 may be disposed on the second passivation layer 235 on the PIN diode 230. The bias electrode 243 may be connected to the upper electrode 233 of the PIN diode 230 via a third contact hole 235*a* as a contact hole in the second passivation layer 235 and may apply a bias voltage to the PIN diode 230.

The bias electrode 243 may be branched from a bias line BL arranged in parallel to the readout line RL.

A planarization layer 245 may disposed on the bias electrode 243 to overlay a whole surface of the base substrate 210 including the PIN diode 230. The planarization layer 245 may be made of an organic material such as photo acryl (PAC), but is not limited thereto.

A scintillator layer 260 may be disposed on the planarization layer 245 to overlay the PIN diode 230.

In some examples, the scintillator layer 260 is disposed above each of the thin film transistor 220 and the PIN diode 230 to overlay each of the thin film transistor 220 and the PIN diode 230.

As the scintillator layer 260 may be directly deposited on the array substrate, the planarization of a lower surface of the scintillator layer 260 may be needed. Therefore, the planarization layer 245 is disposed to planarize the lower surface of the scintillator layer 260 to thereby facilitate the formation of the scintillator layer 260 by deposition of the scintillator.

The scintillator layer 260 may be grown in a vertical direction to have a plurality of columnar crystal phases, such that a plurality of scintillator columnar crystals may be arranged in a side-by-side manner, but is not limited thereto. The scintillator may be made of a material such as cesium iodide (CsI), but is not limited thereto.

In some examples, in the case of the readout circuit region, the second electrostatic induction capacitor electrode 184 is disposed on the base substrate 210, an insulating layer may be disposed between the second electrostatic induction capacitor electrode 184 and the first electrostatic induction capacitor electrode 182 and the first electrostatic induction capacitor electrode 182 may be disposed above the second electrostatic induction capacitor electrode 184.

In this case, the insulating layer between the second electrostatic induction capacitor electrode 184 and the first electrostatic induction capacitor electrode 182 may be a gate insulating layer 222.

In this example, the second electrostatic induction capacitor electrode 184 may be made of the same material as the gate electrode 221 and may be formed on the same layer as the gate electrode 221 and the first electrostatic induction capacitor electrode 182 may be made of the same material as each of the first electrode 225*a* and the second electrode 225*b* and may be formed on the same layer as each of the first electrode 225*a* and the second electrode 225*b*.

In this case, a second capacitor $C_2$ is disposed between the second electrostatic induction capacitor electrode 184 and the first electrostatic induction capacitor electrode 182 and the second electrostatic induction capacitor electrode 184 may be made of different material from that of the first electrostatic induction capacitor electrode 182 for formation of the capacitor.

An insulating layer may be disposed between the first electrostatic induction capacitor electrode 182 and the electrostatic induction line 180 and the electrostatic induction line 180 may be disposed above the first electrostatic induction capacitor electrode 182.

In this case, the insulating layers between the first electrostatic induction capacitor electrode 182 and the electrostatic induction line 180 may be a first passivation layer 226 and a second passivation layer 235.

Therefore, the electrostatic induction line 180 may be made of the same material as the bias electrode 243 and may be formed on the same layer as the bias electrode 243.

In this case, a first capacitor $C_1$ is disposed between the first electrostatic induction capacitor electrode 182 and the electrostatic induction line 180 and the first electrostatic induction capacitor electrode 182 and the electrostatic induction line 180 may be made of different materials from each other for formation of the capacitor.

The readout circuit pad connection line 173 may be disposed on the same layer as the electrostatic induction line 180 and may be spaced apart from the electrostatic induction line 180. The readout circuit pad connection line 173 may be made of the same material as the bias electrode 243 and may be disposed on the same layer as the bias electrode 243.

In this case, the electrostatic induction line 180 has a width $W_2$ that is thinner than the width $W_1$ of the readout circuit pad connection line 173 and may have a greater resistance than that of the readout circuit pad connection line 173.

Figure 5A:
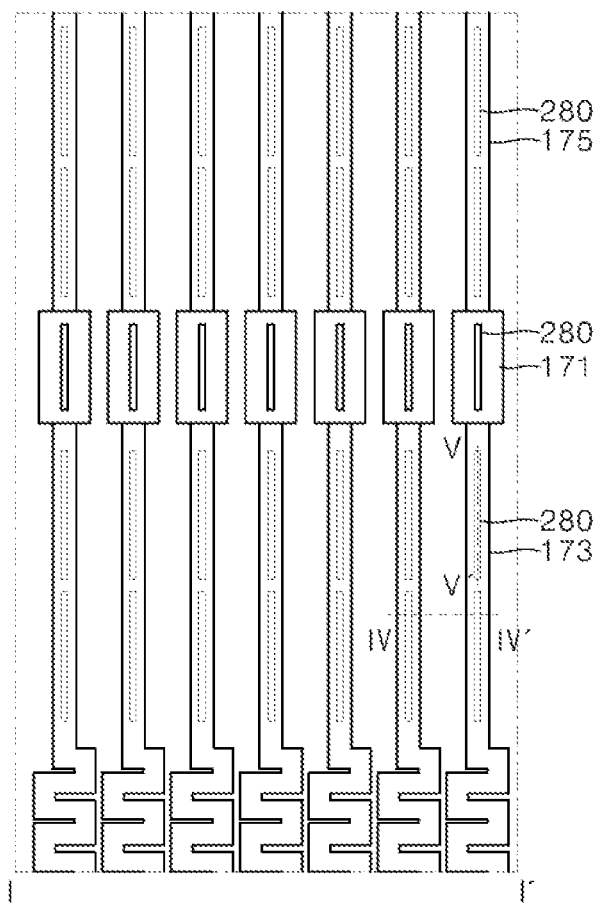
FIGS. 5A and 5B show plan enlarged views showing an example area taken along line I-I' of a digital X-ray detector device in the present disclosure.

Hereinafter, another aspect of the present disclosure is described in detail with reference to FIGS. 5A and 5B, which are enlarged plan views showing example areas taken along line I-I' (shown in FIG. 2) of a digital X-ray detector device and the overlapping contents with the above description are omitted.

One or more readout circuit pads 171 are disposed within the readout circuit area of the non-driving area NAA and are electrically connected to the driving area AA.

In addition, at least one readout circuit pad connection line 173 is disposed between the driving area AA and the at least one readout circuit pad 171 to electrically connect the driving area AA to the at least one readout circuit pad 171 and each of the readout circuit pad connection liens 173 is connected to a first end of one of the readout circuit pads 171.

In this case, at least one electrostatic induction line 280 having a greater resistance than that of the readout circuit pad connection line 173 is additionally connected to the readout circuit pad connection line 173.

The electrostatic induction line 280 overlaps with the readout circuit pad connection line 173, is disposed below the readout circuit pad connection line 173, and may be arranged in parallel to the readout circuit pad connection line 173 along the readout circuit pad connection line 173.

The electrostatic induction line 280 is spaced apart from the readout circuit pad connection line 173 and may be electrically connected to the readout circuit pad connection line 173 through a contact hole in the insulating layer.

The electrostatic induction line 280 may have a thinner width than that of the readout circuit pad connection line 173 and may have a greater resistance than that of the readout circuit pad connection line 173.

In this case, the electrostatic induction line 280 may be made of material including ITO having a high resistance.

Accordingly, the electrostatic induction line 280 may have the greater resistance than that of the readout circuit pad connection line 173.

In some cases where the static electricity is introduced through the readout circuit pad connection line 173, the readout circuit pad connection line 173 may not burst, but the electrostatic induction line 280 with greater resistance may burst at an area with greater resistance due to the greater resistance of the electrostatic induction line 280 than that of the readout circuit pad connection line 173.

In some cases where the static electricity is introduced into the readout circuit pad connection line 173, the electrostatic induction line 280 bursts to dissipate the static electricity, thereby minimizing damage to the elements due to the introduction of the static electricity into the driving area.

An electrostatic induction line 280 may be connected to one readout circuit pad connection line 173. In some examples, a plurality of electrostatic induction lines 280 are connected to a readout circuit pad connection line 173 to minimize the damages to the elements due to the inflow of the static electricity.

In addition, one or more electrostatic induction lines 280 are additionally connected below the readout circuit pad 171 to minimize an influence of the static electricity introduced through the readout circuit pad 171.

In this case, the electrostatic induction line 280 is additionally connected to below the readout circuit pad 171 to minimize short circuit between the adjacent readout circuit pad 171 and electrostatic induction line 280 and minimize the influence of the static electricity.

Figure 5B:
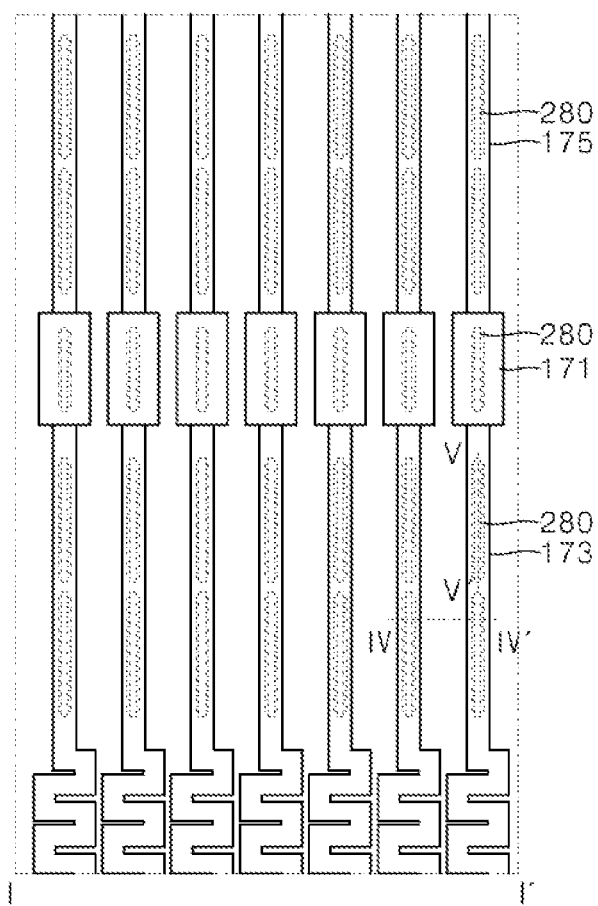

In some examples, as shown in FIG. 5B as another aspect of the present disclosure, the electrostatic induction line 280 may have a pattern in which an increase or decrease in width is repeated.

The electrostatic induction line 280 has the pattern in which the increase or the decrease in width is repeated to facilitate the burst of the electrostatic induction line 280 at a place where bottleneck occurs based on the static electricity.

The readout circuitry connection line 175 may be connected to the readout circuit pad 171 at a second side opposite to a first side of the readout circuit pad 171 to which the readout circuit pad connection line 173 is connected.

The readout circuitry connection line 175 is disposed between the readout circuit pad 171 and the readout circuit portion 140 to electrically connect the readout circuit pad 171 to the readout circuitry 140.

An electrostatic induction line 280 is additionally connected to the readout circuitry connection line 175 to effectively solve the static electricity introduced through the readout circuitry 140 or the readout circuitry connection line 175.

Figure 6:
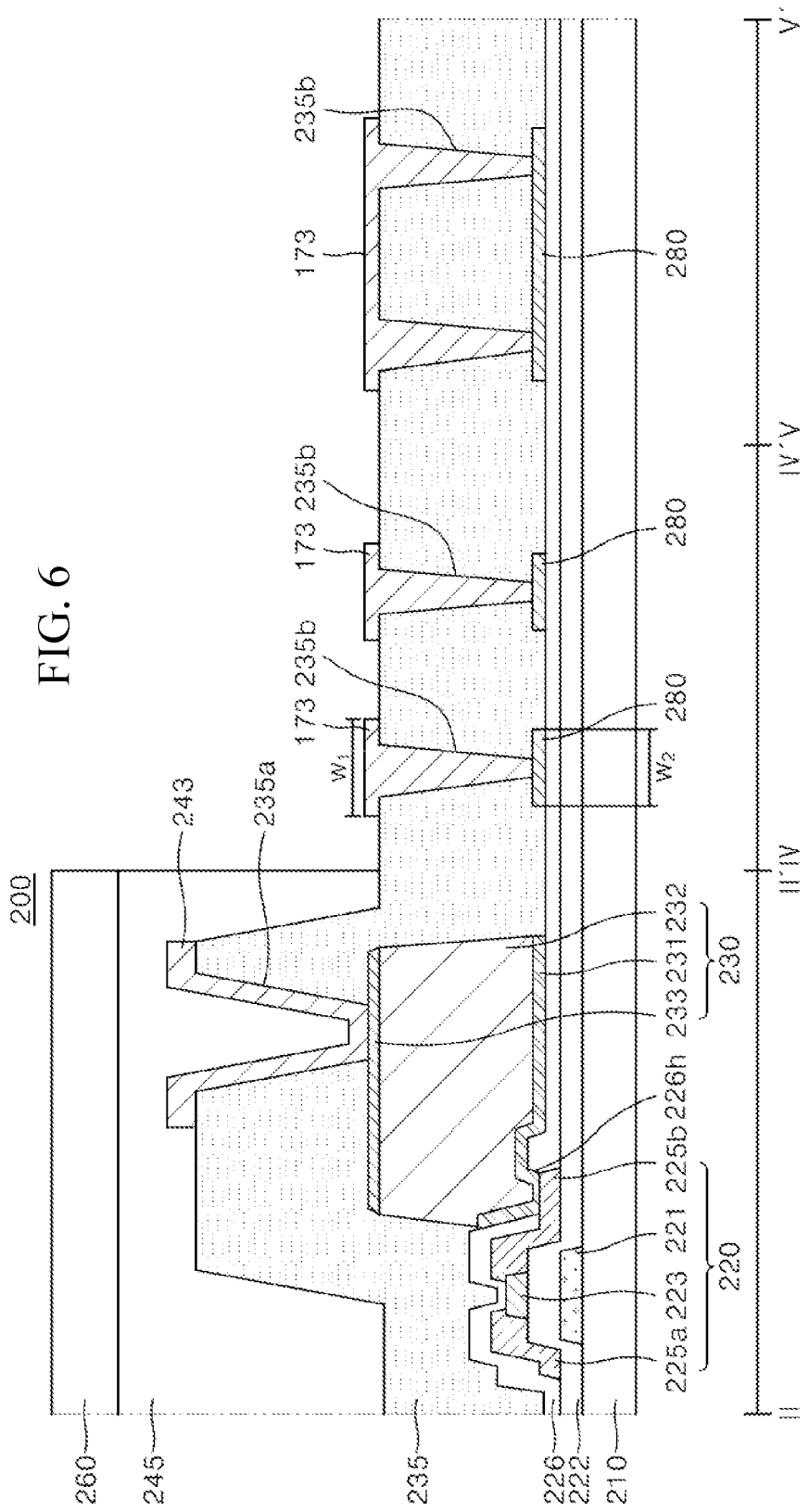
FIG. 6 is an enlarged cross-sectional view showing areas taken along line I-II', line IV-IV', and line V-V' of a digital X-ray detector device in the present disclosure.

FIG. 6 is an enlarged cross-sectional view showing example area taken along each of line II-II' (shown in FIG. 2), line IV-IV' (shown in FIGS. 5A-5B), and line V-V' (shown in FIGS. 5A-5B) of a digital X-ray detector device. Hereinafter, another aspect of the present disclosure is described in detail with reference to FIG. 6.

However, the description of the area taken along line II-II' overlaps with the contents described with reference to FIG. 4 and details thereof are omitted.

In a readout circuit region, an electrostatic induction line 280 may be disposed above a base substrate 210.

An insulating layer may be disposed between the electrostatic induction line 280 and a readout circuit pad connection line 173 and the readout circuit pad connection line 173 may be disposed above the electrostatic induction line 280. The electrostatic induction line 280 may be electrically connected to the readout circuit pad connection line 173 through a contact hole in the insulating layer between the electrostatic induction line 280 and the readout circuit pad connection line 173.

For example, the electrostatic induction line 280 may be disposed on a first passivation layer 226, a second passivation layer 235 may be disposed on the electrostatic induction line 280, and a readout circuit pad connection line 173 may be disposed on the second passivation layer 235.

In addition, the electrostatic induction line 280 and the readout circuit pad connection line 173 may be electrically connected to each other through a third contact hole 235b in the second passivation layer 235.

Therefore, the electrostatic induction line 280 is made of the same material as the upper electrode 233 of the PIN diode 230 and is disposed on the same layer as the upper electrode 233 of the PIN diode 230, and the readout circuit pad connection line 173 is made of the same material as the bias electrode 243 and may be disposed on the same layer as the bias electrode 243.

In this case, the electrostatic induction line 280 has a width $W_2$ thinner than a width $W_1$ of the readout circuit pad connection line 173 and may have a greater resistance than that of the readout circuit pad connection line 173.

In addition, the electrostatic induction line 280 may be arranged in parallel along the readout circuit pad connection line 173 as shown in the cross section taken along line V-V'.

In addition, the readout circuit pad connection line 173 is electrically connected to the electrostatic induction line 280 through two third contact holes 235b in the second passivation layer 235 to allow the static electricity to flow toward the electrostatic induction line 280. For example, both ends of the readout circuit pad connection line 173 may be electrically connected to the electrostatic induction line 280 through the two third contact holes 235b in the second passivation layer 235.

The digital X-ray detector device 200 according to the present disclosure operates as follows.

X-ray is irradiated to the digital X-ray detector device 200. The scintillator layer 260 converts the X-ray into the visible light. The PIN layer 232 of the PIN diode 230 converts the light in the visible region into an electrical signal.

For example, when the light in the visible region is irradiated to the PIN layer 232, the I-type semiconductor layer is depleted by each of the N-type semiconductor layer and the P-type semiconductor layer, thereby generating an electric field therein. Then, holes and electrons generated by the light drift based on the electric field and are collected into the P-type semiconductor layer and the N-type semiconductor layer, respectively.

The PIN diode 230 converts the light in the visible region into the electrical signal and transmits the electrical signal to the thin film transistor 220. The electrical signal thus transmitted is displayed as an image signal via the readout line RL connected to the thin film transistor 220.

According to the present disclosure, the thin film transistor array substrate for the digital X-ray detector device and the digital X-ray detector device include the base substrate with the driving area and the non-driving area, the at least one readout circuit pad disposed within the non-driving area and electrically connected to the driving area, and at least one readout circuit pad connection line to electrically connect the driving area to the at least one readout circuit pad.

In this case, one or more electrostatic induction lines having a greater resistance than that of the readout circuit pad connection line are further connected to the readout circuit pad connection line.

The electrostatic induction line may not overlap with the readout circuit pad connection line, and may be disposed between the readout circuit pad connection lines adjacent to each other, the electrostatic induction line has a thinner width than that of the readout circuit pad connection line, and one or more capacitors may be disposed below the electrostatic induction line.

The electrostatic induction line overlaps with the readout circuit pad connection line, may be disposed below the readout circuit pad connection line, the electrostatic induction line may be made of the material including ITO, and the electrostatic induction line may have a pattern in which the increase or decrease in width is repeated.

The driving area may include the driving thin film transistor, the PIN diode, and the bias electrode. The driving thin film transistor includes the active layer, the first electrode, the second electrode, and the gate electrode. The PIN diode is electrically connected to the driving thin film transistor and includes the upper electrode, the PIN layer, and the lower electrode. The bias electrode is electrically connected to the PIN diode.

In this case, the electrostatic induction line may be made of the same material as the bias electrode and may be disposed on the same layer as the bias electrode, and a first electrostatic induction capacitor electrode and a second electrostatic induction capacitor electrode are disposed below the electrostatic induction line.

The first electrostatic induction capacitor electrode may be made of the same material as each of the first electrode and the second electrode and may be disposed on the same layer as each of the first electrode and the second electrode. The second electrostatic induction capacitor electrode may be made of the same material as the gate electrode and may be disposed on the same layer as the gate electrode.

In addition, the electrostatic induction line may be made of the same material as the upper electrode and may be disposed on the same layer as the upper electrode.

One or more of the electrostatic induction lines may be additionally connected below the readout circuit pad.

In addition, according to the present disclosure, the digital X-ray detector device may include the thin film transistor array substrate for the digital X-ray detector device, a readout circuitry connected to the readout circuit pad, at least one readout circuitry connection line disposed above the base substrate and configured to electrically connect the readout circuit pad to the readout circuitry, and the scintillator disposed above the thin film transistor array substrate and the at least one electrostatic induction line may be additionally connected to the readout circuitry connection line.

Although the present disclosure has been described with reference to the exemplary drawings, the present disclosure is not limited to the aspects and the drawings disclosed herein, and various modifications may be made by those skilled in the art within the scope of the technical idea of the present disclosure. Further, even if working effects obtained based on configurations of the present disclosure are not explicitly described in the description of aspects of the present disclosure, effects predictable based on the corresponding configuration have to be recognized.

What is claimed is:

1. A thin film transistor array substrate for a digital X-ray detector device, comprising:
    a base substrate where a driving area and a non-driving area are defined;
    at least one readout circuit pad disposed in the non-driving area and electrically connected to the drive area;
    at least one readout circuit pad connection line electrically connecting the driving area to the at least one readout circuit pad; and
    at least one electrostatic induction line electrically connected to the at least one readout circuit pad connection line,
    wherein the at least one electrostatic induction line has a greater resistance than a resistance of the at least one readout circuit pad connection line.

2. The thin film transistor array substrate of claim 1, wherein the at least one electrostatic induction line does not overlap with the at least one readout circuit pad connection line and is disposed between the at least one readout circuit pad connection lines that are adjacent to each other.

3. The thin film transistor array substrate of claim 2, wherein the at least one electrostatic induction line has a width that is smaller than a width of the at least one readout circuit pad connection line.

4. The thin film transistor array substrate of claim 3, further comprising at least one capacitor disposed below the at least one electrostatic induction line.

5. The thin film transistor array substrate of claim 2, wherein the driving area comprises a driving thin film transistor, a PIN diode, and a bias electrode,
    wherein the driving thin film transistor comprises an active layer, a first electrode, a second electrode and a gate electrode,
    wherein the PIN diode is electrically connected to the driving thin film transistor and comprises an upper electrode, a PIN layer and a lower electrode, and
    wherein the bias electrode is electrically connected to the PIN diode.

6. The thin film transistor array substrate of claim 5, wherein the at least one electrostatic induction line is made of a same material as the bias electrode and disposed on a same layer as the bias electrode.

7. The thin film transistor array substrate of claim 5, further comprising first and second electrostatic induction capacitor electrodes disposed below the at least one electrostatic induction line.

8. The thin film transistor array substrate of claim 7, wherein the first electrostatic induction capacitor electrode is made of a same material as the first electrode and the second electrode and is disposed on a same layer as the first electrode and the second electrode.

9. The thin film transistor array substrate of claim 7, wherein the second electrostatic induction capacitor electrode is made of a same material as the gate electrode and is disposed on a same layer as the gate electrode.

10. The thin film transistor array substrate of claim 1, wherein the at least one electrostatic induction line overlaps with the at least one readout circuit pad connection line and is disposed below the at least one readout circuit pad connection line.

11. The thin film transistor array substrate of claim 10, wherein the at least one electrostatic induction line is made of material comprising indium tin oxide (ITO).

12. The thin film transistor array substrate of claim 10, wherein the at least one electrostatic induction line has a pattern has a repeatedly increased or decreased width.

13. The thin film transistor array substrate of claim 10, wherein the driving area comprises a driving thin film transistor, a PIN diode, and a bias electrode,
   wherein the driving thin film transistor comprises an active layer, a first electrode, a second electrode, and a gate electrode,
   wherein the PIN diode is electrically connected to the driving thin film transistor and includes an upper electrode, a PIN layer, and a lower electrode,
   wherein the bias electrode is electrically connected to the PIN diode, and
   wherein the at least one electrostatic induction line is made of a same material as the upper electrode and is disposed on a same layer as the upper electrode.

14. The thin film transistor array substrate of claim 1, wherein the at least one electrostatic induction line is further connected below the at least one readout circuit pad.

15. A digital X-ray detector device, comprising:
   a base substrate where a driving area and a non-driving area are defined;
   at least one readout circuit pad disposed in the non-driving area and electrically connected to the drive area;
   at least one readout circuit pad connection line electrically connecting the driving area to the at least one readout circuit pad;
   at least one electrostatic induction line electrically connected to the at least one readout circuit pad connection line, wherein the at least one electrostatic induction line has a greater resistance than a resistance of the at least one readout circuit pad connection line;
   a readout circuitry configured to be connected to the readout circuit pad;
   at least one readout circuitry connection line disposed above the base substrate and configured to electrically connect the readout circuit pad to the readout circuitry; and
   a scintillator layer disposed above the thin film transistor array substrate,
   wherein the at least one electrostatic induction line is further connected to the at least one readout circuitry connection line.

16. A thin film transistor array substrate having a driving area and a non-driving area for a digital X-ray detector device, comprising:
   one or more readout circuit pads disposed in the non-driving area and electrically connected to the drive area;
   one or more readout circuit pad connection lines electrically connecting the driving area to the one or more readout circuit pads;
   one or more electrostatic induction lines electrically connected to the one or more readout circuit pad connection lines and having a greater resistance than a resistance of the one or more readout circuit pad connection lines; and
   one or more capacitors having first and second electrostatic induction capacitor electrodes and disposed below the one or more electrostatic induction lines.

17. The thin film transistor array substrate of claim 16, wherein the one or more electrostatic induction lines do not overlap with the one or more readout circuit pad connection lines and is disposed between the one or more readout circuit pad connection lines that are adjacent to each other.

18. The thin film transistor array substrate of claim 16, wherein the one or more electrostatic induction lines have a width that is smaller than a width of the one or more readout circuit pad connection lines.

19. The thin film transistor array substrate of claim 16, wherein the one or more electrostatic induction lines overlap with the one or more readout circuit pad connection lines and are disposed below the one or more readout circuit pad connection lines.

20. The thin film transistor array substrate of claim 16, wherein the one or more electrostatic induction lines are further connected below the one or more readout circuit pads.

* * * * *